(12) United States Patent
Singh et al.

(10) Patent No.: US 11,740,956 B2
(45) Date of Patent: Aug. 29, 2023

(54) PROBABILISTIC DATA INTEGRITY SCAN WITH AN ADAPTIVE SCAN FREQUENCY

(71) Applicant: Micron Technology, Inc., Boise, ID (US)

(72) Inventors: Gaurav Singh, Kolkata (IN); Prashant Parashari, Hyderabad (IN)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/397,789

(22) Filed: Aug. 9, 2021

(65) Prior Publication Data

US 2023/0040070 A1    Feb. 9, 2023

(51) Int. Cl.
*G06F 11/07* (2006.01)
*G06F 3/06* (2006.01)

(52) U.S. Cl.
CPC .......... *G06F 11/079* (2013.01); *G06F 3/0619* (2013.01); *G06F 3/0659* (2013.01); *G06F 3/0673* (2013.01); *G06F 11/073* (2013.01); *G06F 11/076* (2013.01)

(58) Field of Classification Search
CPC .... G06F 11/079; G06F 11/073; G06F 11/076; G06F 3/0619; G06F 3/0659; G06F 3/0673
See application file for complete search history.

(56) References Cited

U.S. PATENT DOCUMENTS

| | | | |
|---|---|---|---|
| 9,509,621 B2 | 11/2016 | Gulati et al. | |
| 9,513,982 B1 * | 12/2016 | Wu | B29C 64/153 |
| 9,640,242 B1 * | 5/2017 | Lo | G11C 11/4074 |
| 10,868,769 B1 * | 12/2020 | Matthews | H04L 47/6225 |
| 2010/0142281 A1 | 6/2010 | Yoo et al. | |
| 2010/0265764 A1 | 10/2010 | Yoo et al. | |
| 2012/0060058 A1 | 3/2012 | Prakash | |
| 2014/0301498 A1 | 10/2014 | Rimini et al. | |

(Continued)

FOREIGN PATENT DOCUMENTS

| | | | |
|---|---|---|---|
| KR | 10-2020-0036508 A | 4/2020 | |
| WO | 94/19748 A2 | 9/1994 | |

OTHER PUBLICATIONS

Notice of Allowance, U.S. Appl. No. 17/397,838, dated Sep. 16, 2022, 9 pages.

(Continued)

*Primary Examiner* — Jigar P Patel
(74) *Attorney, Agent, or Firm* — NICHOLSON DE VOS WEBSTER & ELLIOTT LLP (57) ABSTRACT

Exemplary methods, apparatuses, and systems include receiving a plurality of read operations. The read operations are divided into a current set of a sequence of read operations and one or more other sets. The size of the current set is a first number of read operations. An aggressor read operation is selected from the current set. A first data integrity scan is performed on a victim of the aggressor and a first indicator of data integrity is determined based on the first data integrity scan. A scaling factor is determined using the indicator of data integrity and a number of program erase cycles for the portion of memory. The set size of read operations is adjusted to a second number of read operations using the scaling factor for a subsequent set.

20 Claims, 5 Drawing Sheets

(56) References Cited

U.S. PATENT DOCUMENTS

| | | | |
|---|---|---|---|
| 2015/0058561 A1* | 2/2015 | Ash | G06F 3/0689 |
| | | | 711/114 |
| 2018/0129612 A1 | 5/2018 | Lewis et al. | |
| 2018/0182465 A1* | 6/2018 | Alhussien | G06F 11/1068 |
| 2018/0374549 A1* | 12/2018 | Padilla | G11C 16/3422 |
| 2019/0272881 A1 | 9/2019 | Padilla et al. | |
| 2020/0066342 A1* | 2/2020 | Ha | G11C 29/52 |
| 2020/0104057 A1 | 4/2020 | Kim et al. | |
| 2020/0104071 A1 | 4/2020 | Sallese et al. | |
| 2020/0104073 A1 | 4/2020 | Byun | |
| 2020/0192791 A1 | 6/2020 | Yang et al. | |
| 2021/0319834 A1 | 10/2021 | Sharifi et al. | |

OTHER PUBLICATIONS

International Search Report and Written Opinion, PCT App. No. PCT/US2022/037203, dated Oct. 25, 2022, 8 pages.

Non-Final Office Action, U.S. Appl. No. 17/397,853, dated Jan. 12, 2023, 8 pages.

Notice of Allowance, U.S. Appl. No. 17/397,853, dated Mar. 1, 2023, 7 pages.

\* cited by examiner

PROBABILISTIC DATA INTEGRITY SCAN WITH AN ADAPTIVE SCAN FREQUENCY

TECHNICAL FIELD

The present disclosure generally relates to the mitigation of read disturb errors in a memory subsystem, and more specifically, relates to determining and using an adaptive data integrity scan window for a probabilistic data integrity scan scheme.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to implementing a probabilistic data integrity scan scheme in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

Data reliability in a memory can degrade as the memory device increases in density (e.g., device components scale down in size, when multiple bits are programmed per cell, etc.). One contributor to this reduction in reliability is read disturb. Read disturb occurs when a read operation performed on one portion of the memory (e.g., a row of cells), often referred to as the aggressor, impacts the threshold voltages in another portion of memory (e.g., a neighboring row of cells), often referred to as the victim. Memory devices typically have a finite tolerance for these disturbances. A sufficient amount of read disturb effects, such as a threshold number of read operations performed on neighboring aggressor cells, can change the victim cells in the other/unread portion of memory to different logical states than originally programmed, which results in errors.

A memory system can track read disturb by using counters per subdivision of memory and reprogramming a given subdivision of memory when the counter reaches a threshold value. A probabilistic data integrity scheme consumes less storage by counting or otherwise tracking sets of read operations in a portion of memory (e.g., a die, logical unit, etc.) and performing a limited data integrity scan by checking the error rate of one or more read disturb victims of a randomly selected read operation in each set (also referred to as window). When the set or window size is set to a fixed value based on the worst-case scenario of memory reliability, however, the probabilistic data integrity scheme data integrity scans more often than needed for portions of memory with reliability metrics that are better than the worst-case scenario. For example, a probabilistic data integrity scan based on a worst-case scenario of memory reliability can result a drop in bandwidth (when compared to using read disturb counters) due to scanning portions of memory more often than needed because not all portions of memory perform at worst-case scenario levels of reliability.

Aspects of the present disclosure address the above and other deficiencies by dynamically selecting or otherwise adapting the scan frequency for each portion of memory based upon the reliability of that portion of memory. A greater scan frequency correlates to a smaller probabilistic data integrity scan window size while a lesser scan frequency correlates to a larger probabilistic data integrity scan window size. For example, the window size can be adapted using a scaling factor based upon an error rate or other reliability metric for the portion of memory. As a result, a probabilistic data integrity scheme can initiate data integrity scans based upon actual measures of reliability—reducing the frequency of scans and increasing bandwidth of portions of memory with good reliability and without sacrificing reliability coverage for those portions of memory that represent the worst-case scenario. Additionally, the window size can be adapted using hysteresis or similar limits on changes to prevent hasty and swinging changes in scan frequency.

Figure 1:
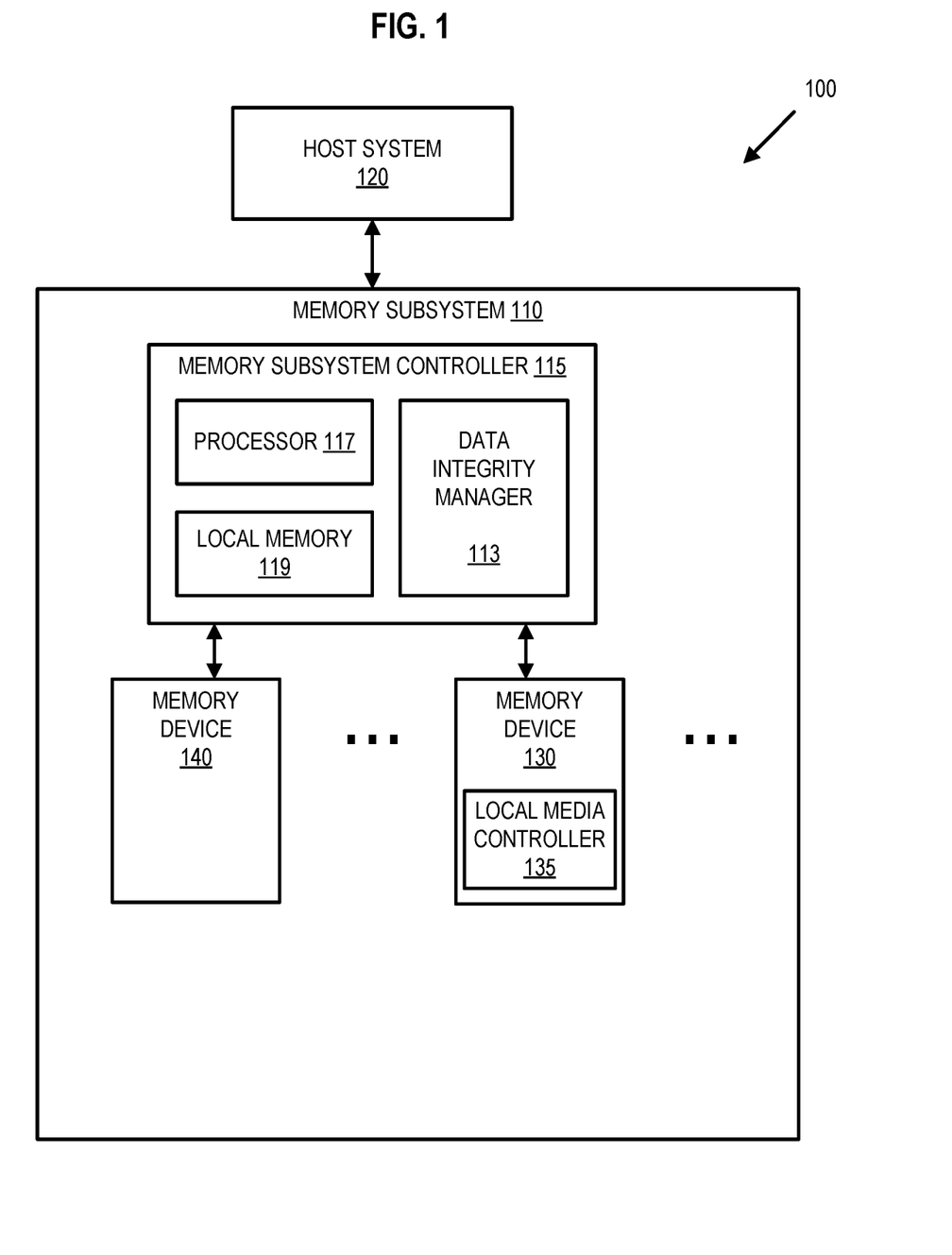
FIG. 1 illustrates an example computing system that includes a memory subsystem in accordance with some embodiments of the present disclosure.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a data integrity manager 113 that mitigates read disturb and other data errors. In some embodiments, the controller 115 includes at least a portion of the data integrity manager 113. For example, the controller 115 can include a processor 117 (processing device) configured to execute instructions stored in local memory 119 for performing the operations described herein. In some embodiments, a data integrity manager 113 is part of the host system 120, an application, or an operating system.

The data integrity manager 113 can implement and manage a read disturb mitigation scheme. For example, the data integrity manager 113 can implement an adaptive data integrity scan frequency for a probabilistic data integrity scan scheme. Further details with regards to the operations of the data integrity manager 113 are described below.

Figure 2:
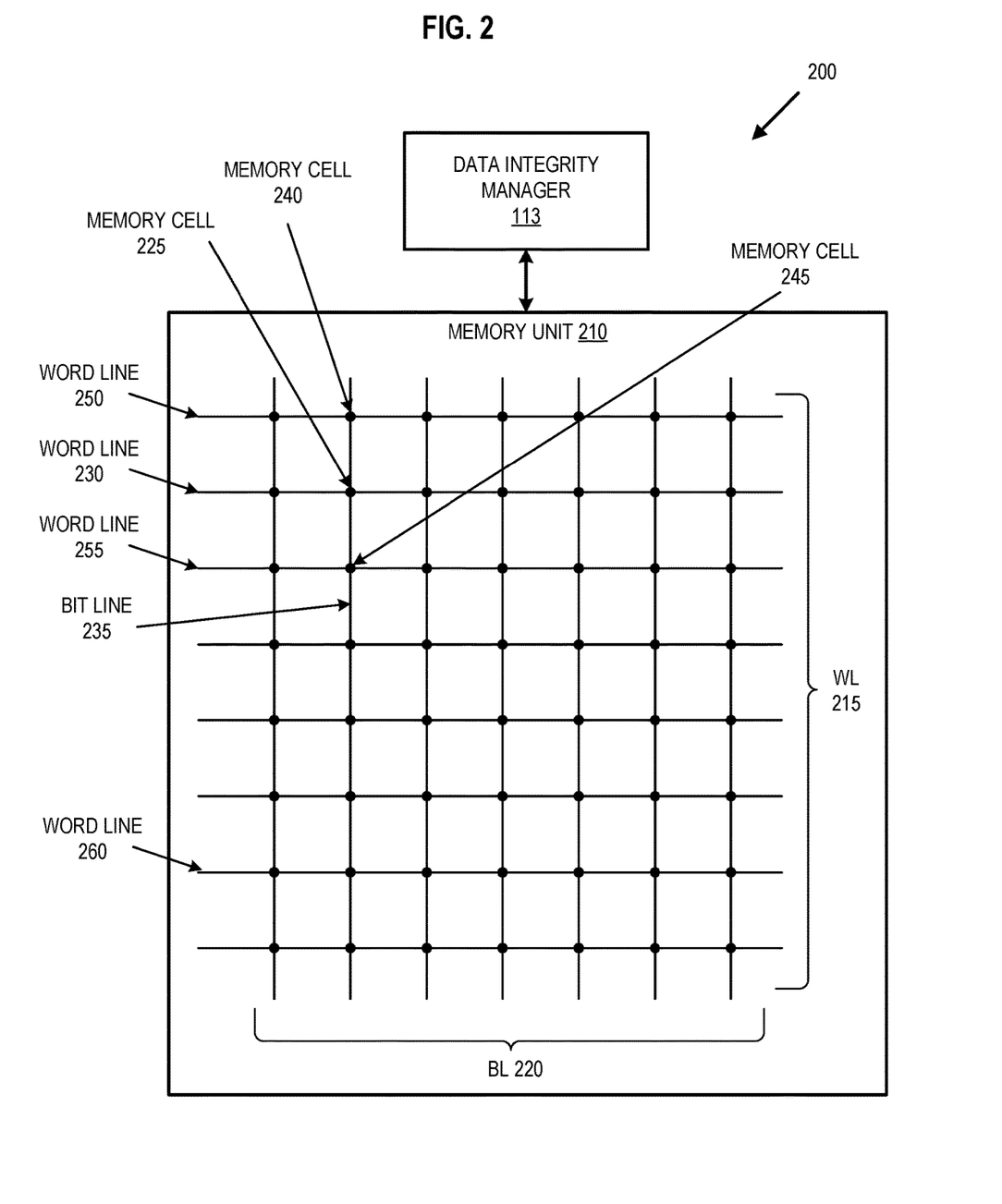
FIG. 2 illustrates an example of managing a portion of a memory subsystem in accordance with some embodiments of the present disclosure.

FIG. 2 illustrates an example of managing a portion of a memory subsystem 200 in accordance with some embodiments of the present disclosure. In one embodiment, the data integrity manager 113 implements a read disturb mitigation scheme per memory unit 210. For example, the data integrity manager 113 can perform a separate probabilistic read disturb mitigation scheme per LUN.

The illustration of the memory unit 210 includes an array of memory cells. The memory 210 illustrates a small number of memory cells for the sake of providing a simple explanation. Embodiments of the memory unit 210 can include far greater numbers of memory cells.

Each memory unit 210 includes memory cells that the memory subsystem 110 accesses via word lines 215 and bit lines 220. For example, a memory device 130 can read a page of memory using word line 230. Within that page, memory cell 225 is accessed via word line 230 and bit line 235. As described above, reading a memory cell can result in read disturb effects on other memory cells. For example, a read of memory cell 225 (the aggressor) can result disturbing memory cells 240 and 245 (the victims). Similarly, a read of other memory cells of word line 230 (the aggressor) can result in disturbing other memory cells of word lines 250 and 255 (the victims).

This disturb effect can increase the error rate for victim memory cells. In one embodiment, the data integrity manager 113 measures the error rate of a portion of memory as a raw bit error rate (RBER). In another embodiment, the data integrity manager 113 can use other measurements to represent an error rate or data reliability, such as voltage distribution values (e.g., a read threshold voltage distribution). In one embodiment, the data integrity manager 113 compares current, recent, or average voltage distribution values to ideal or expected voltage distribution values (e.g., values that result from a new or stress-free memory) and the magnitude of difference represents the error rate or other indication of data reliability. The data integrity manager 113 can track and mitigate read disturb by tracking read operation traffic in the memory unit 210 and checking the error rate of victim(s). For example, the data integrity manager 113 can select a read operation directed to word line 230 as the aggressor for testing read disturb and perform a read of word lines 250 and 255 to determine the error rate of each. In response to detecting an error rate of a given victim portion of memory satisfying a threshold error rate value, the data integrity manager 113 can migrate data from the victim portion of memory to different portion of memory.

In one embodiment, the data integrity manager 113 also maintains one or more indicators of data integrity (e.g., RBER or other data reliability values) performing data integrity scans. For example, the data integrity manager 113 can compare an RBER value of a current data integrity scan to one or more saved maximum RBER values and replace a saved value when the RBER value of the current data integrity scan exceeds the saved value. The data integrity manager 113 uses the saved representative data reliability value(s) to dynamically update the window size of the probabilistic read disturb handling scheme. This and other features of the probabilistic read disturb handling scheme is described further with reference to FIGS. 3-4.

Figure 3:
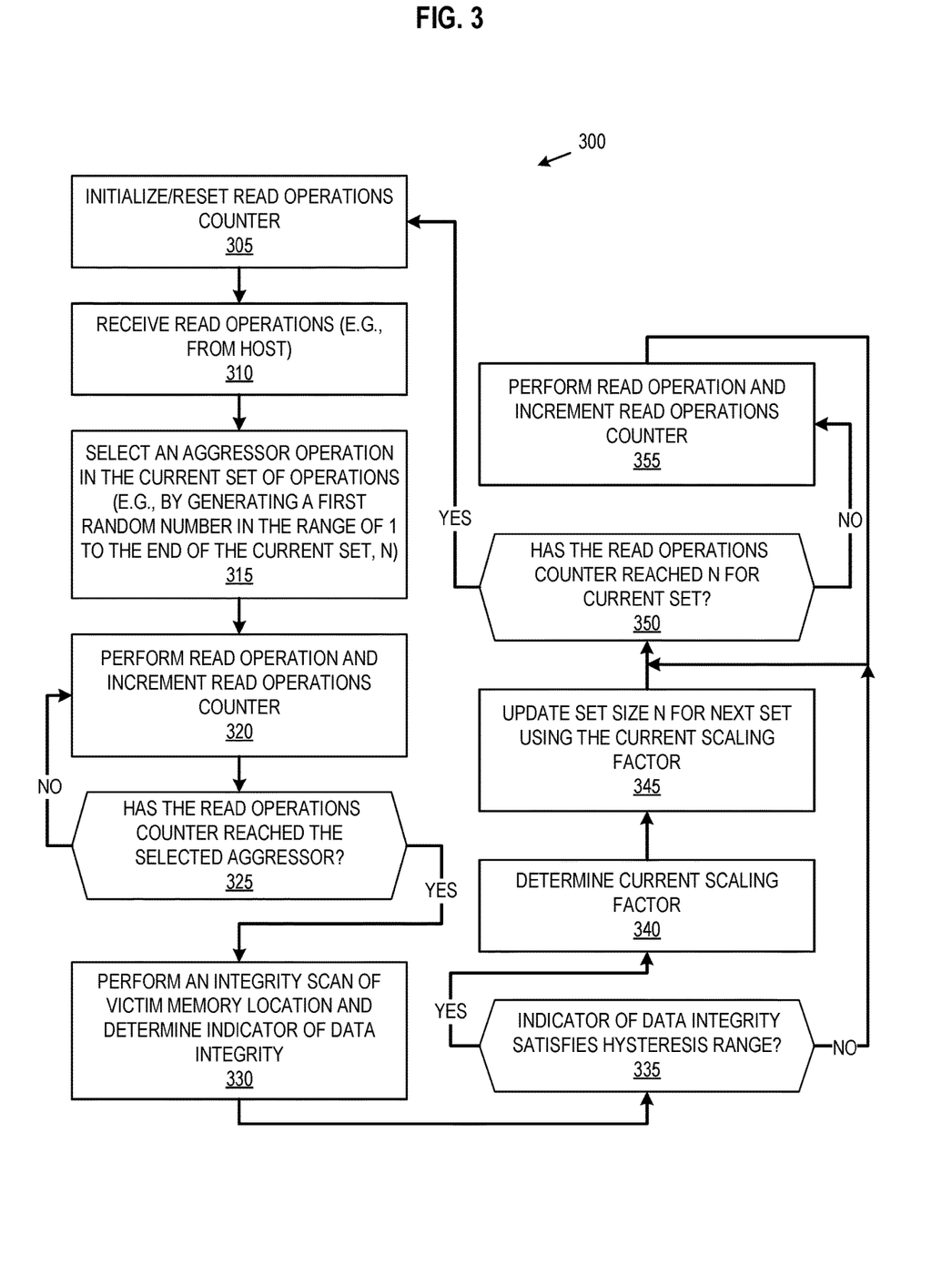
FIG. 3 is a flow diagram of an example method to implement an adaptive data integrity scan frequency for a probabilistic data integrity scan scheme in accordance with some embodiments of the present disclosure.

FIG. 3 is a flow diagram of an example method 300 to implement an adaptive data integrity scan frequency for a probabilistic data integrity scan scheme in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device initializes or resets a counter for tracking the processing of read operations. For example, the processing device can set the counter to zero to begin tracking the processing of read operations in a set of read operations. In one embodiment, the processing device processes operations in sets of sequences of read operations. For example, if a set includes 10,000 read operations, the counter is initialized or reset to a state that allows it to count at least 10,000 read operations. The number of operations per set is a dynamic value, however, and will referred to here as N.

At operation 310, the processing device receives read operation requests. Read requests can be received from one or more host systems and/or generated by another process within the memory subsystem 110. The processing device can receive read operation requests asynchronously, continuously, in batches, etc. In one embodiment, the memory subsystem 110 receives operation requests from one or more host systems 120 and stores those requests in a command queue. The processing device can process the read operations, from the command queue and/or as internally generated, in sets of N operations.

At operation 315, the processing device selects an aggressor operation in the current set of operations. When implementing a probabilistic read disturb handling scheme, the processing device can select an aggressor in the current set by generating a random number (e.g., a uniform random number) in the range of 1 to N and, when the count of read operations reaches the random number in the current set, identifying the current/last read operation as the aggressor.

At operation 320, the processing device performs a read operation. For example, the memory subsystem 110 reads a page of data by accessing the memory cells along a word line and returning the data to the host system 120 or internal process that initiated the read request. Additionally, the processing device increments the read operations counter. For example, the processing device can increment the counter in response to completing a read operation to track the current position in the sequence of read operations in the current set.

At operation 325, the processing device determines if the read operations counter has reached the aggressor operation in the set. For example, the processing device can compare the value of the counter to the first random number generated to identify the aggressor read operation in the current set. If the counter has not yet reached the position in the sequence corresponding to the aggressor operation, the method 300 returns to operation 320 to continue the performance of the next read operation, as described above. If the counter has reached the position in the sequence corresponding to the aggressor operation, the method 300 proceeds to operation 330.

At operation 330, the processing device performs an integrity scan of the victim(s) of the selected aggressor. For example, the processing device can execute a read of each victim to determine an indicator of data integrity of the victim. In one embodiment, this includes checking the error rate, such as a raw bit error rate (RBER), for the victim. In another embodiment, determining an indicator of data integrity of the victim includes comparing the threshold voltage distribution of the victim/sampled portion of memory with an expected voltage distribution. When using threshold voltage distributions as indicators of data reliability, the processing device can compare the "shape" of measured distribution values/histogram against ideal values by determining if the shape is monotonically increasing/decreasing, compare local minima, comparing the width of histograms, determining an amount of shift (left/right) of histograms, etc. As another example, the processing device can compare the "population" of threshold voltage distributions/histograms or portions thereof (e.g., between certain read positions). A recent histogram population that satisfies a threshold increase from an ideal population between read positions can serve as an indication of data reliability (or lack thereof). As another example, the processing device can evaluate a margin compared to a threshold error correction limit—the lower the measured margin, the worse the data reliability. For simplicity of describing examples below, it should be understood that a maximum value can be used interchangeably with a worst value.

If the error rate of a victim memory location satisfies a fold threshold (e.g., meets or exceeds an error rate threshold value), the processing device folds the data by, e.g., error correcting the data of the victim memory location and writing the corrected data to a new location.

The processing device can maintain one or more data integrity values per various subdivisions of memory—e.g., per die/LUN, plane, independent word line segment, group of word lines, group of LUN's, block or group of blocks, etc. In one embodiment, the processing device determines an average or other combination of indicators to reflect the data integrity value for a subdivision of memory. For example, the processing device can determine an indicator of data integrity for each block of memory in a LUN and average or combine the indicators of data integrity as an indicator for the entire LUN.

At operation 335, the processing device determines if the indicator of data integrity of the victim satisfies a hysteresis range. For example, the processing device can use a range of data integrity values for a portion of memory and an indicator of data integrity that is within that range can trigger an update to the data integrity scan frequency. Using error rates to continue the example, an error rate below a hysteresis range minimum will not trigger a change in the window size/scan frequency. Additionally, an error rate above a hysteresis range maximum can trigger folding the data of the scanned portion of memory as described above rather than an update to the window size/scan frequency.

If the indicator of data integrity of the victim satisfies/falls within the hysteresis range, the method 300 proceeds to operation 340. If the indicator of data integrity of the victim does not satisfy/fall within the hysteresis range, the method 300 proceeds to operation 350. In another embodiment, the processing device bypasses operation 335 and proceeds to operation 340.

At operation 340, the processing device determines a current scaling factor using the indicator of data integrity. The processing device can also determine the current scaling factor using the indicator of data integrity and a number of program/erase cycles (PEC) for the portion of memory. In one embodiment, the processing device uses a weighted formula with the indicator of data integrity and PEC as inputs. For example, the current scaling factor (CSF) can be determined using a formula based upon a weighted exponential curve, such as:

$$CSF=1/\sqrt{((W1\times PEC)(W2\times RBER^2))}$$

W1 and W2 represent different weight values. In one embodiment W1 and W2 are fixed values. In another embodiment, W1 and W2 are dynamic values that are based upon a ratio of a range of PEC values (between a PEC maximum value and a PEC minimum value) and a default window size corresponding to that range. For example, the following formulas can be used to derive the weights:

$$W1=(PEC\ Max-PEC\ Min)/(10\times Default\ Window\ Size)$$

$$W2=(PEC\ Max-PEC\ Min)/(Default\ Window\ Size)$$

Reads directed to the memory subsystem can be distributed per workload. As a result, a few blocks/pages in a LUN can have higher numbers of reads when compared to the others. The error rate (or other indicator of data integrity) can, therefore, vary significantly even within a single LUN. Additionally, particular word lines or other portions of memory can be more susceptible to data integrity issues than others. The folding of a block or other portion of memory can lead to a significant reduction of error rate (or other indicator of data integrity) for a portion of memory. Given these factors, there can be significant differences/changes in indication of data integrity depending on the selected aggressor and corresponding victim(s). Embodiments can use a hysteresis scheme to avoid hasty fluctuations in the window size. In one embodiment, the processing device modifies the current scaling factor based on a historic scaling factor (HSF). For example, the processing device can use the scaling factor used in the most recent adaptation of the window size (as the HSF) in combination with the current scaling factor. For example, the following formula can be used to modify the CSF:

$$Modified\ CSF=(W3\times HSF)+(W4\times CSF)$$

W3 and W4 represent different weight values. In one embodiment, W3 is larger than W4 (to bias the historic scaling factor and reduce change in the current scaling factor) and W3+W4=1. In one embodiment W3 and W4 are fixed values. In another embodiment, W3 and W4 are dynamic values that are based upon the indicator of data integrity. For example, W3 will increase and w4 will decrease as the indicator of data integrity approaches the folding threshold.

At operation 345, the processing device updates the set size for the next set of operations. For example, the processing device changes the data integrity scan window size by updating the number of operations per set, N, starting with the next set or, if delayed, another subsequent set. In one embodiment, the processing device determines the updated value of N by multiplying the CSF (or modified CSF) by the current value of N. The current set continues with the use of the current value of N while the processing device stores the updated of value of N (or CSF) to be applied to the next set. As a result, the processing device can decrease the window size to scan more victims as the values of data integrity indicators increase and increase the window size to scan fewer victims as the values of data integrity indicators decrease. With the dynamic window size changes being bidirectional, embodiments can set an initial or default value of N (e.g., after a power cycle) to a small window size or to a large window size and allow subsequent sets to adjust the window size dynamically as needed. In one embodiment, the default value of N is set based on characterization data for the portion of memory (e.g., determined at the time of manufacturing or as a result of testing thereafter), a workload type for the portion of memory, and/or a number of PEC. In one embodiment, the processing device stores a current value of N in non-volatile memory and that value of N is used following a power cycle.

At operation 350, the processing device determines if the read operations counter has reached the end of the current set. For example, the processing device can compare the value of the counter to the value of N for the current set. If the read operations counter has reached the end of the current set, the method 300 proceeds to operation 305 to reset the counter (e.g., to the value of N for the next set) and process the next set of read operations. If the read operations counter has not reached the end of the current set, the method 300 proceeds to operation 360.

At operation 355, the processing device performs a read operation and increments the read operations counter as described above with reference to operation 325. The method 300 proceeds to operation 350 to once again determine if the read operations counter has reached the end of the current set.

Figure 4:
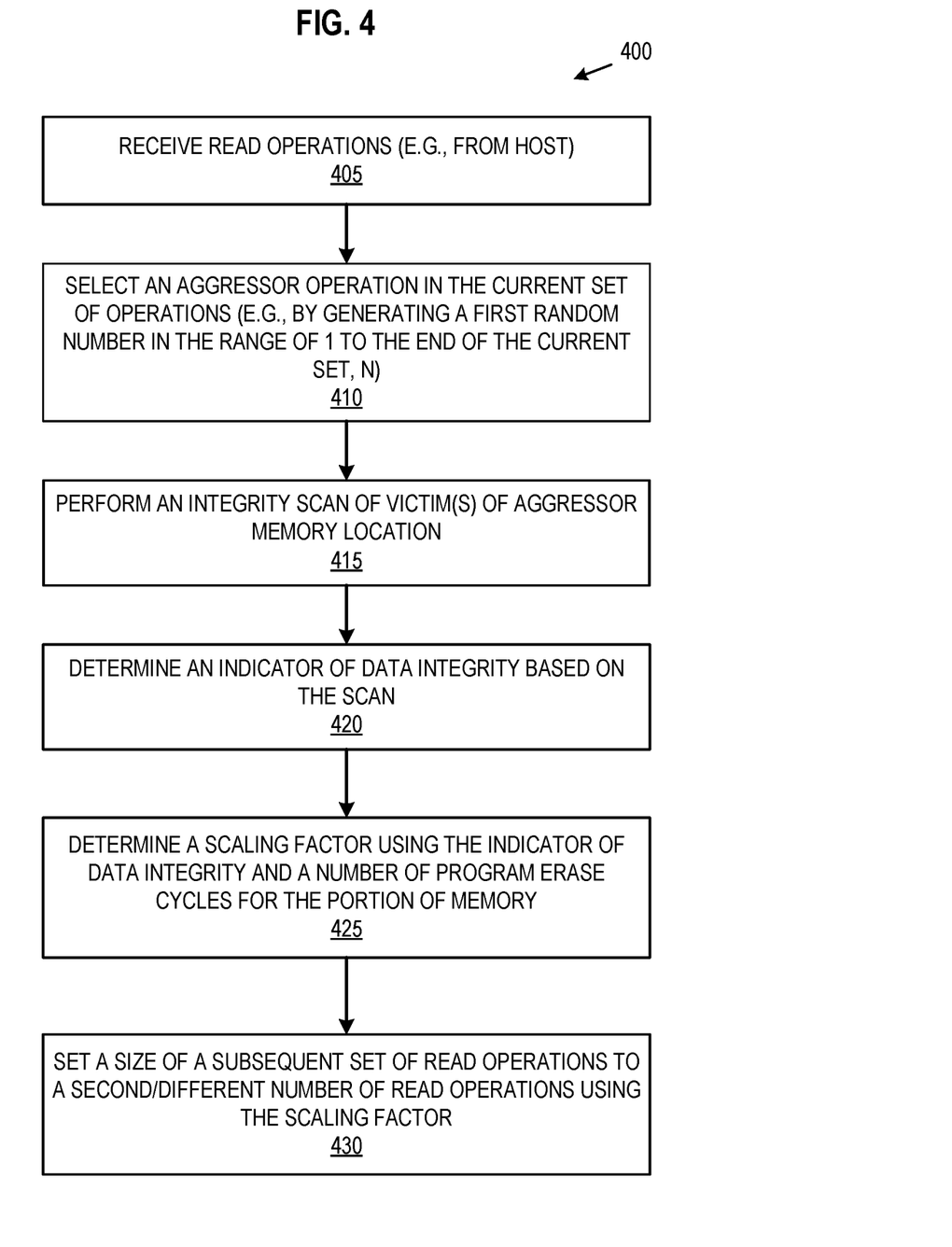
FIG. 4 is flow diagram of another example method to implement an adaptive data integrity scan frequency for a probabilistic data integrity scan scheme in accordance with some embodiments of the present disclosure.

FIG. 4 is flow diagram of another example method to implement an adaptive data integrity scan frequency for a probabilistic data integrity scan scheme in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the data integrity manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives read operations, e.g., as described with reference to operation 310. The processing device divides the read operations into sets of read operations. For example, the processing device can use a counter to track a number, N, of operations to be performed per set.

At operation 410, the processing device selects an aggressor read operation in the current set of operations. For example, the processing device can randomly select a read operation in the current set to identify one or more victims to be the subject of a data integrity scan.

At operation 415, the processing device performs a data integrity scan of the victim memory location(s). For example, the processing device can execute a read of the victim(s) to check the error rate of each as described above with respect to operation 330.

At operation 420, determines an indicator of data integrity based on the scan. For example, the processing device determines the RBER or the threshold voltage distribution of the victim/sampled portion of memory as described above with respect to operation 330.

At operation 425, the processing device determines a scaling factor using the indicator of data integrity and a number of PEC for the portion of memory. For example, the processing device can determine a scaling factor as described above with respect to operation 340.

At operation 430, the processing device sets a size of a subsequent set of read operations to a second/different number of read operations using the scaling factor. For example, the processing device can update the set size, N, for one or more subsequent sets as described above with respect to operation 345.

Figure 5:
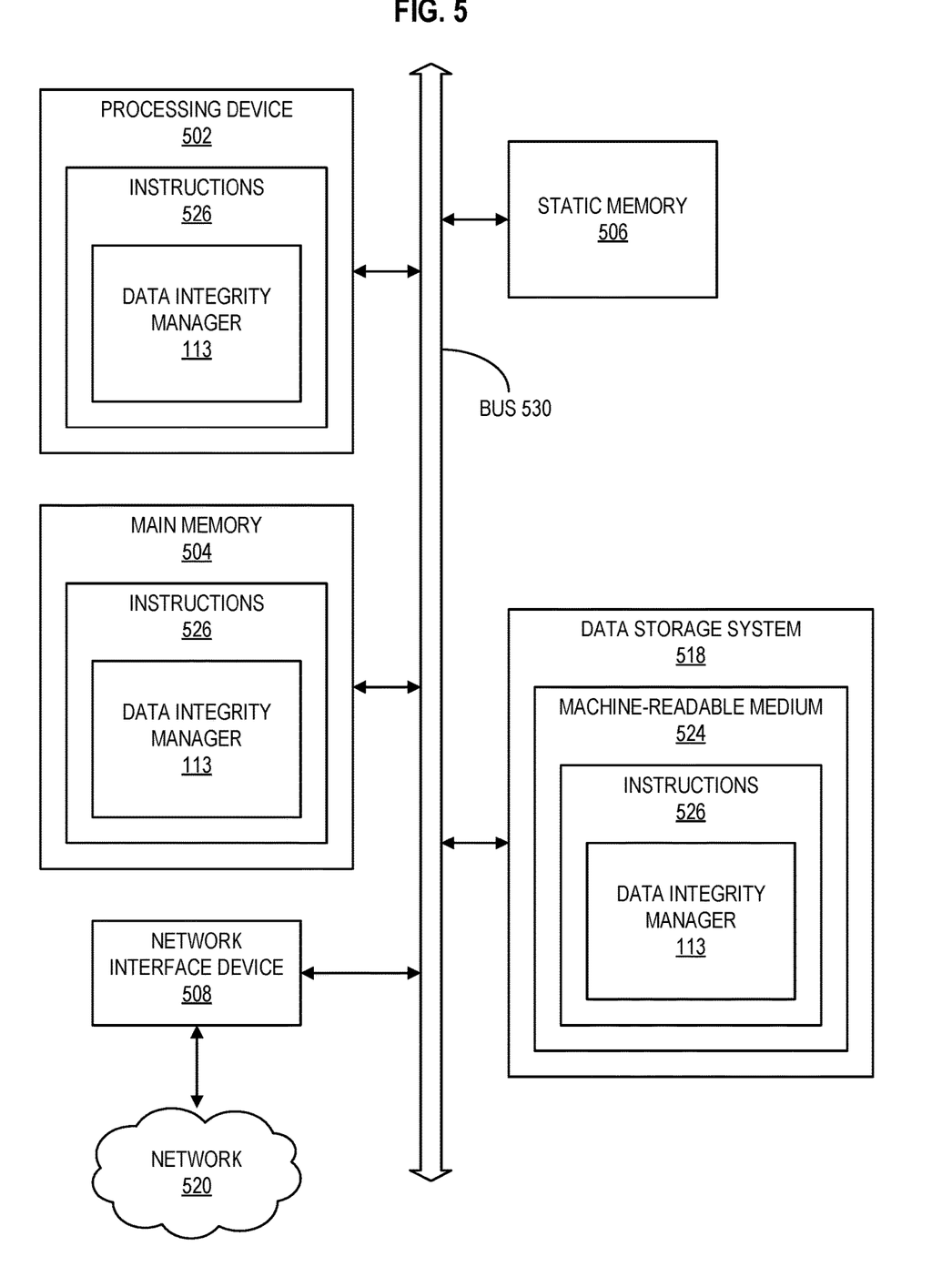
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the data integrity manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to a data integrity manager (e.g., the data integrity manager 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300-400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    receiving a plurality of read operations directed to a portion of memory, the plurality of read operations divided into a current set of a sequence of read operations and one or more other sets of sequences of read operations, a set size being a first number of read operations in each of the current set and the one or more other sets;
    selecting an aggressor read operation from the current set based on the set size;
    performing a data integrity scan on a victim of the aggressor read operation;
    determining an indicator of data integrity based on the data integrity scan;
    determining a scaling factor using the indicator of data integrity and a number of program erase cycles for the portion of memory; and
    adjusting the set size for a subsequent set of read operations of the one or more other sets to a second number of read operations using the scaling factor, the second number being different than the first number.

2. The method of claim 1, wherein the second number is less than the first number.

3. The method of claim 1, wherein the indicator of data integrity is a bit error rate.

4. The method of claim 1, wherein determining the scaling factor using the indicator of data integrity and the number of program erase cycles includes multiplying the indicator of data integrity by a first weight and multiplying the number of program erase cycles by a second weight.

5. The method of claim 1, wherein determining the scaling factor is performed in response to determining the indicator of data integrity is within a hysteresis range.

6. The method of claim 1, the determining of the scaling factor comprising:
    determining a sum of a first product value and a second product value, the first product value resulting from multiplying an historic scaling factor value and a first weight and the second product value resulting from multiplying a current scaling factor by a second weight.

7. The method of claim 6, wherein a sum of the first and second weights is one and the first weight is greater than the second weight.

8. A non-transitory computer-readable storage medium comprising instructions that, when executed by a processing device, cause the processing device to:
    receive a plurality of read operations directed to a portion of memory, the plurality of read operations divided into a current set of a sequence of read operations and one or more other sets of sequences of read operations, a set size a first number of read operations in each of the current set and the one or more other sets;
    select an aggressor read operation from the current set based on the set size;
    perform a data integrity scan on a victim of the aggressor read operation;
    determine an indicator of data integrity based on the data integrity scan;
    determine a scaling factor using the indicator of data integrity and a number of program erase cycles for the portion of memory; and
    adjust the set size for a subsequent set of read operations of the one or more other sets to a second number of read operations using the scaling factor, the second number being different than the first number.

9. The non-transitory computer-readable storage medium of claim 8, wherein the indicator of data integrity is a bit error rate.

10. The non-transitory computer-readable storage medium of claim 8, wherein determining the scaling factor using the indicator of data integrity and the number of program erase cycles includes multiplying the indicator of data integrity by a first weight and multiplying the number of program erase cycles by a second weight.

11. The non-transitory computer-readable storage medium of claim 8, wherein determining the scaling factor is performed in response to determining the indicator of data integrity is within a hysteresis range.

12. The non-transitory computer-readable storage medium of claim 8, wherein the processing device is further to
    determine a sum of a first product value and a second product value, the first product value resulting from multiplying an historic scaling factor value and a first weight and the second product value resulting from multiplying a current scaling factor by a second weight.

13. The non-transitory computer-readable storage medium of claim 12, wherein a sum of the first and second weights is one and the first weight is greater than the second weight.

14. A system comprising:
a plurality of memory devices; and
a processing device, operatively coupled with the plurality of memory devices, to:
- receive a plurality of read operations directed to a portion of memory, the plurality of read operations divided into a current set of a sequence of read operations and one or more other sets of sequences of read operations, a set size being a first number of read operations in each of the current set and the one or more other sets;
- select an aggressor read operation from the current set based on the set size;
- perform a data integrity scan on a victim of the aggressor read operation;
- determine an indicator of data integrity based on the data integrity scan;
- determine a scaling factor using the indicator of data integrity and a number of program erase cycles for the portion of memory; and
- adjust the set size for a subsequent set of read operations of the one or more other sets to a second number of read operations using the scaling factor, the second number being different than the first number.

15. The system of claim 14, wherein the second number is less than the first number.

16. The system of claim 14, wherein the indicator of data integrity is a bit error rate.

17. The system of claim 14, wherein determining the scaling factor using the indicator of data integrity and the number of program erase cycles includes multiplying the indicator of data integrity by a first weight and multiplying the number of program erase cycles by a second weight.

18. The system of claim 14, wherein determining the scaling factor is performed in response to determining the indicator of data integrity is within a hysteresis range.

19. The system of claim 14, wherein the processing device is further to:
- determine a sum of a first product value and a second product value, the first product value resulting from multiplying an historic scaling factor value and a first weight and the second product value resulting from multiplying a current scaling factor by a second weight.

20. The system of claim 19, wherein a sum of the first and second weights is one and the first weight is greater than the second weight.

* * * * *